United States Patent
Hsu et al.

(10) Patent No.: US 6,906,354 B2
(45) Date of Patent: Jun. 14, 2005

(54) T-RAM CELL HAVING A BURIED VERTICAL THYRISTOR AND A PSEUDO-TFT TRANSFER GATE AND METHOD FOR FABRICATING THE SAME

(75) Inventors: Louis L. Hsu, Fishkill, NY (US); Rajiv V. Joshi, Yorktown Heights, NY (US); Fariborz Assaderaghi, San Diego, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/880,223

(22) Filed: Jun. 13, 2001

(65) Prior Publication Data

US 2002/0190265 A1 Dec. 19, 2002

(51) Int. Cl.[7] .......................... H01L 29/32; H01L 29/423
(52) U.S. Cl. .......................... 257/107; 257/121; 257/124
(58) Field of Search ............................... 257/107, 121, 257/124

(56) References Cited

U.S. PATENT DOCUMENTS

| | | | | |
|---|---|---|---|---|
| 89,024 | A | * | 4/1869 | Carpenter |
| 96,689 | A | * | 11/1869 | Button |
| 109,150 | A | * | 11/1870 | Sterling ........................ 432/81 |
| 158,254 | A | * | 12/1874 | Curzon ......................... 431/316 |
| 4,060,738 | A | * | 11/1977 | Tasch et al. ................... 365/183 |
| 4,554,644 | A | * | 11/1985 | Chen et al. .................... 365/154 |
| 5,357,125 | A | * | 10/1994 | Kumagi ......................... 257/133 |
| 5,514,882 | A | * | 5/1996 | Shulman ....................... 257/105 |
| 5,543,639 | A | * | 8/1996 | Nakanishi et al. ............. 257/133 |
| 5,659,185 | A | * | 8/1997 | Iwamuro ....................... 257/138 |
| RE36,770 | E | * | 7/2000 | Piccone ........................ 257/124 |
| 6,229,161 | B1 | * | 5/2001 | Nemati et al. ................ 257/133 |
| 6,441,406 | B1 | * | 8/2002 | Nakanishi et al. ............ 257/119 |
| 6,448,586 | B1 | * | 9/2002 | Nemati et al. ................ 257/133 |
| 6,462,359 | B1 | * | 10/2002 | Nemati et al. ................ 257/107 |
| 6,465,830 | B2 | * | 10/2002 | Babcock et al. .............. 257/302 |
| 6,465,848 | B2 | * | 10/2002 | Ker et al. ..................... 257/355 |
| 6,472,686 | B1 | * | 10/2002 | Shah ............................ 257/77 |
| 6,492,662 | B2 | * | 12/2002 | Hsu et al. ..................... 257/124 |

FOREIGN PATENT DOCUMENTS

| | | | |
|---|---|---|---|
| DE | 4210071 | * | 9/1993 |
| EP | A 559133 | * | 3/1992 |
| EP | A 533439 | * | 3/1993 |

OTHER PUBLICATIONS

*A Novel–Thyristor–based SRAM Cell (T–RAM) for High––Speed, Low–Voltage, Giga–scale Memories* by Farid Nemati and James D. Plummer, Center for Integrated Systems, Stanford, University, 1999.

*A Novel High Density, Low Voltage SRAM Cell with a Vertical NDR Device*, by Farid Nemati and James D. Plummer, Center for Integrated Systems, Stanford University, 1998.

* cited by examiner

*Primary Examiner*—Long Pham
*Assistant Examiner*—Shrinivas H. Rao
(74) *Attorney, Agent, or Firm*—Louis J. Percello

(57) ABSTRACT

A T-RAM array having a plurality of T-RAM cells is presented where each T-RAM cell has dual devices. Each T-RAM cell is planar and has a buried vertical thyristor and a horizontally stacked pseudo-TFT transfer gate. The buried vertical thyristor is located beneath the horizontally stacked pseudo-TFT transfer gate. A method is also presented for fabricating the T-RAM array having the buried vertical thyristors, the horizontally stacked pseudo-TFT transfer gates and the planar cell structure.

4 Claims, 5 Drawing Sheets

T-RAM CELL HAVING A BURIED VERTICAL THYRISTOR AND A PSEUDO-TFT TRANSFER GATE AND METHOD FOR FABRICATING THE SAME

FIELD OF THE INVENTION

This invention relates to the field of integrated circuit (IC) design. Specifically, the invention relates to a Thyristor Random Access Memory (T-RAM) cell and method for fabricating the same. More specifically, the invention relates to a T-RAM cell having a buried vertical thyristor, a stacked pseudo-TFT transfer gate and a planar cell structure, and method for fabricating the same.

BACKGROUND OF THE INVENTION

A low-power, high-speed and high-density negative differential resistance (NDR) based (NDR-based) SRAM cell which can provide DRAM-like densities at SRAM-like speeds has been proposed by Farid Nemati and James D. Plummer in "A Novel High Density, Low Voltage SRAM Cell with a Vertical NDR Device," 1998 Symposium on VLSI Technology Digest of Technical Papers, IEEE, pages 66–67, 1998.

The memory device structure is shown by FIG. 1 and is designated by reference numeral 10; the memory device structure is called a Thyristor-based Random Access Memory (T-RAM) cell. The T-RAM device or memory cell 10 consists of a thin vertical pnpn thyristor 12 with a surrounding nMOS gate 14 as the bistable element and a planar nMOSFET as the access transistor 16. The circuit schematic of the T-RAM cell 10 is shown by FIG. 2.

To access the T-RAM cell 10, two wordlines are necessary. The first wordline WL1 is used to control an access gate of the transfer nMOSFET device 16, while the second wordline WL2 is the surrounding nMOS gate 14 which is used to control the switch of the vertical pnpn thyristor 12. The thyristor 12 is connected to a reference voltage Vref. The second wordline WL2 improves the switching speed of the thyristor 12 from 40 ns to 4 ns with a switching voltage. A bitline BL connects the T-RAM cell 10 to a sense amplifier for reading and writing data from and to the T-RAM cell 10. The T-RAM cell 10 exhibits a very low standby current in the range of 10 pA.

When writing a "high", the bitline BL is set at low, and both wordlines WL1, WL2 are switched on. At this moment, the thyristor 12 behaves like a forward biased pn diode. After a write operation, both gates are shut off, and a "high" state is stored in the thyristor 12. In a read operation, only the first wordline WL1 is activated, a large "on" current will read on the bitline BL through the access gate. When writing a "low", the bitline BL is set at "high" state, and both wordlines WL1, WL2 are switched on. At this moment, the thyristor 12 behaves like a reverse biased diode. After the write operation, both gates are shut off, and a "low" state is stored in the thyristor 12. Similarly, in a consequence read, a very low current will be detected on the bitline BL. Further details of the operation of the T-RAM cell 10 and its gate-assisted switching are described in Nemati et al.; the contents of which are incorporated herein by reference.

A T-RAM array having a plurality of T-RAM cells 10 has demonstrated a density equivalent to that of DRAM arrays and a speed equivalent to that of SRAM arrays. Hence, the T-RAM array provides advantages afforded by both SRAM and DRAM arrays. These advantages make T-RAM an attractive choice for future generations of high speed, low-voltage, and high-density memories and ASICs.

However, there are several drawbacks of the T-RAM cell 10. First, there is the requirement of forming the thyristor 12 having a vertical pillar on a substrate during a fabrication process. Difficulties arise in controlling the dimensions of the vertical pillar and reproducing these dimensions for each T-RAM cell 10 in the T-RAM array. Second, due to the existence of a vertical thyristor 12 in each T-RAM cell 10, each T-RAM cell 10 is not planar and therefore difficult to scale. Third, it is difficult to control the dimension while forming the surrounding base gate around the base of each vertical thyristor 12. Fourth, each T-RAM cell is fabricated prior to or after fabricating any other devices, such as p-MOS and n-MOS support devices (i.e., sense amplifiers, wordline drivers, column and row decoders, etc.), which results in extra fabrication steps, thereby increasing thermal budget and manufacturing cost. Finally, due to these drawbacks, the resulting T-RAM cell 10 cannot be smaller than $8F^2$ and the cost of fabricating a T-RAM array is high.

SUMMARY

An aspect of the present invention is to provide a T-RAM array having a planar cell structure for overcoming the disadvantages of the prior art.

Another aspect of the present invention is to provide a T-RAM array having a plurality of T-RAM cells, wherein each of the plurality of T-RAM cells has a planar cell structure, a buried vertical thyristor and a horizontally stacked pseudo-TFT (Thin-Film Transistor) transfer gate.

Also, another aspect of the present invention is to provide a memory system having a plurality of T-RAM cells arranged in an array, wherein each of the plurality of T-RAM cells has a planar cell structure, a buried vertical thyristor and a horizontally stacked pseudo-TFT transfer gate.

Further, another aspect of the present invention is to provide a method for fabricating a high-density, high-yield and low-cost T-RAM array having a plurality of T-RAM cells and a planar cell structure on a SOI substrate. Each of the plurality of T-RAM cells has a planar cell structure, a buried vertical thyristor and a horizontally stacked pseudo transfer gate.

Another aspect of the present invention is to provide a method for fabricating a T-RAM array which improves performance and yield, and reduces cost and thermal budget.

Other aspects of the present invention is a method for fabricating a surrounded base gate of a buried vertical thyristor of a T-RAM cell and a method of making contact with a horizontally stacked pseudo-TFT transfer gate. Another aspect of the present invention is a method of forming a high-quality, self-aligned pseudo-TFT transfer gate of a T-RAM cell.

Accordingly, in an embodiment of the present invention, a T-RAM array is presented having a planar cell structure and a plurality of T-RAM cells where each T-RAM cell is planar and has a buried vertical thyristor and a horizontally stacked pseudo-TFT transfer gate. The inventive structure of each T-RAM cell results in higher performance at low voltage, e.g., Vdd=1V.

In another embodiment of the present invention, a memory system is presented having a plurality of T-RAM cells arranged in an array. Each of the T-RAM cells in the array has a planar cell structure, a buried vertical thyristor and a horizontally stacked pseudo-TFT transfer gate.

Further still, in another embodiment of the present invention, a method is presented for fabricating a T-RAM array having a planar cell structure. Each of the T-RAM cells in the T-RAM array has a buried vertical thyristor and a horizontally stacked pseudo-TFT transfer gate. The method entails forming a surrounded base gate of the buried vertical thyristor and making contact with the horizontally stacked pseudo-TFT transfer gate. The method also entails forming a high-quality, self-aligned stacked pseudo-TFT transfer gate for each of the T-RAM cells. Preferably, the T-RAM array is built on a semiconductor silicon-on-insulator (SOI) wafer to reduce junction capacitance and improve scalability.

DETAILED DESCRIPTION OF THE INVENTION

The present invention provides a T-RAM array having a planar cell structure and a plurality of T-RAM cells. Each of the T-RAM cells of the inventive T-RAM array is planar and includes a buried vertical thyristor and a horizontally stacked pseudo-TFT transfer gate. Hence, the T-RAM array of the present invention provides for less control during manufacturing, and is planar and more scalable than prior art T-RAM arrays. The present invention also provides a preferred method for fabricating the T-RAM array to reduce cost and thermal budget, while increasing performance, density and yield.

Unlike a DRAM cell, the state of a T-RAM cell does not depend on the amount of charge stored in a capacitor, rather it depends on the internal programming state of the thyristor. In order to maintain the internal programming state of the thyristor, a low DC current is permitted to constantly flow through the thyristor. Similar to an SRAM cell, when the state of the T-RAM cell is stored and latched, a small leakage current flows from Vdd to ground via off-state devices. For an SRAM cell with a resistive load or TFT load, the DC leakage current is required in order to maintain the state of the SRAM cell.

In the present invention, in order to save area, a pseudo-TFT is used as the transfer gate for the inventive T-RAM cell. The pseudo-TFT transfer gate can be fabricated on top of a thyristor of the inventive T-RAM cell which causes the resulting cell area to be very small. The off-state leakage current of the pseudo-TFT transfer gate may be higher than that of a conventional device. However, it is acceptable to be implemented for the inventive T-RAM array disclosed herein, if performance of the T-RAM array is increased and size of the TRAM array is decreased, for a slightly higher standby power. Nonetheless, such a standby current exists in the thyristor of a T-RAM cell whether or not the TFT is used as the transfer gate.

The stacked pseudo-TFT transfer gate of the inventive T-RAM is fabricated using a lateral overgrowth epi technique via a single crystal seed area. The quality and performance of the stacked pseudo-TFT transfer gate is significantly better than that of a conventional TFT device.

Figure 3:
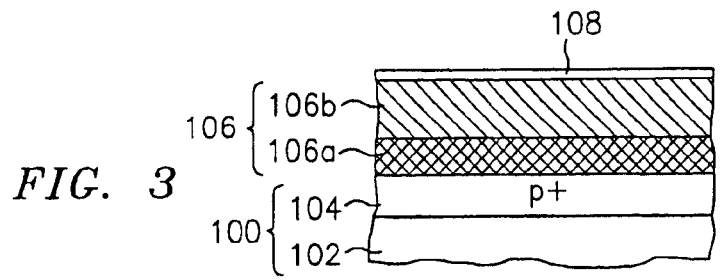
FIG. 3 is a cross-sectional view of a portion of a semiconductor silicon-on-insulator (SOI) wafer having a buried oxide layer and a series of layers for fabricating T-RAM cells according to the present invention.

FIG. 3 is a cross-sectional view of a portion of a semiconductor silicon-on-insulator (SOI) wafer having a buried oxide layer and a series of layers for fabricating T-RAM cells according to the present invention. The wafer is designated by reference numeral 100. It is contemplated that other types of semiconductor wafers besides semiconductor SOI wafers, such as semiconductor bulk wafers, can be used for fabricating T-RAM cells according to the present invention.

With reference to FIG. 3, a semiconductor SOI wafer 100 having a buried oxide layer 102 and a p+ layer 104 is used as the substrate to form the T-RAM cells. The p+ layer 104 is preferably a p+ silicon layer doped with a dosage of between 2E14 $cm^2$ to 8E14/$cm^2$ of boron. The p+ layer 104 will be used to form the p terminal of the thyristor which will be tied to a reference voltage (about one volt) during operation. The p+ layer 104 will also be used as the seed for epitaxial growth as described below.

Over the SOI wafer 100, a predetermined thickness, approximately 4000 Å, of nitride and oxide are deposited to form a nitride-oxide layer 106 having a nitride layer 106a, approximately 1000 Å, and an oxide layer 106b, approximately 3000 Å. A predetermined thickness, approximately 100 to 300 Å, of nitride is deposited over the oxide layer 106b to form a nitride layer 108. The total thickness of the nitride-oxide layer 106 is approximately equal to the height of the thyristor (see FIG. 11).

A description of the preferred method for fabricating a T-RAM cell of the T-RAM array will now be provided. The same fabrication method is used for simultaneously fabricating all of the T-RAM cells of the T-RAM array. With reference to FIGS. 4–11 there are shown cross-sectional views of the semiconductor wafer 100 for fabricating the T-RAM cell.

Figure 4:
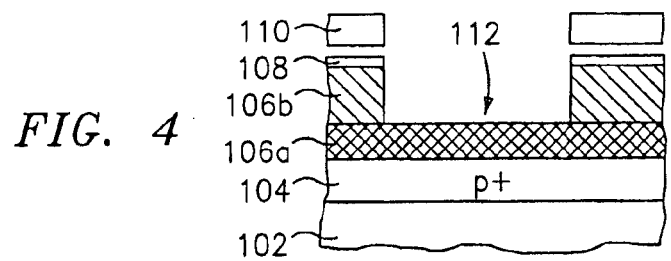
FIGS. 4–11 are cross-sectional views illustrating a preferred process for fabricating a T-RAM cell according to the present invention.

With reference to FIG. 4, a first mask 110 is positioned over the wafer 100. The nitride layer 108 and the nitride-oxide layer 106 are etched to define a thyristor region 112. The height of the thyristor region 112 determines the height of the gate surrounding the base region of the thyristor (see FIG. 11).

Figure 5:
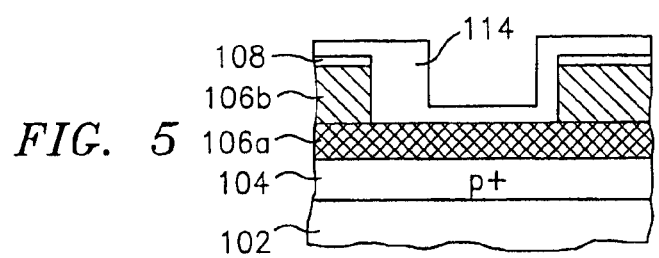
Figure 12:
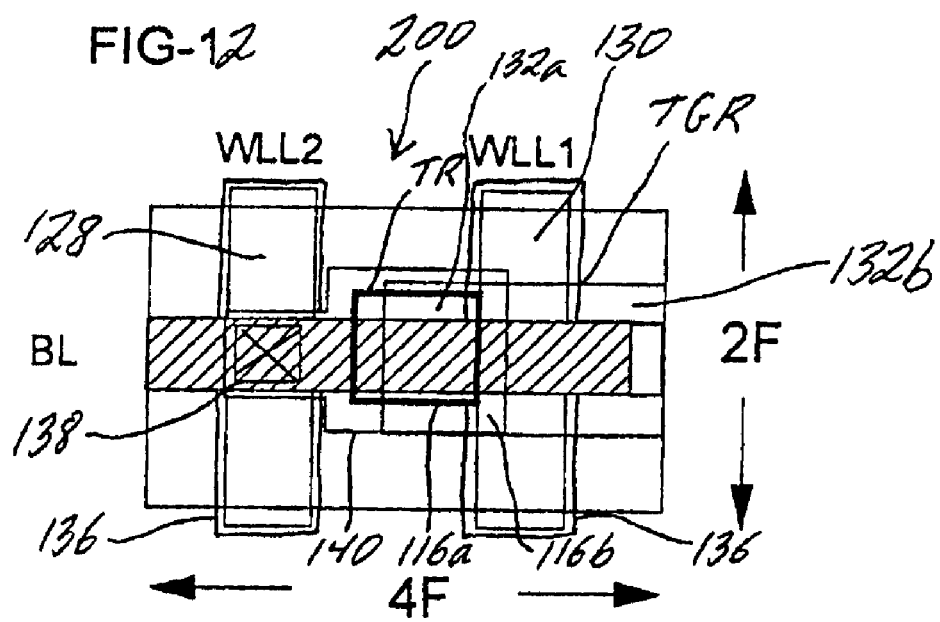
FIG. 12 is a top phantom view of a portion of a T-RAM array showing the T-RAM cell fabricated according to the present invention.

With reference to FIG. 5, an in-situ n+ doped gate polysilicon layer 114 is formed. The dimension on the left of the polysilicon layer 114 is made wider than the dimension on the right of the polysilicon layer 114 because the wider region will be used for gate contact as shown by FIG. 12.

Figure 6:
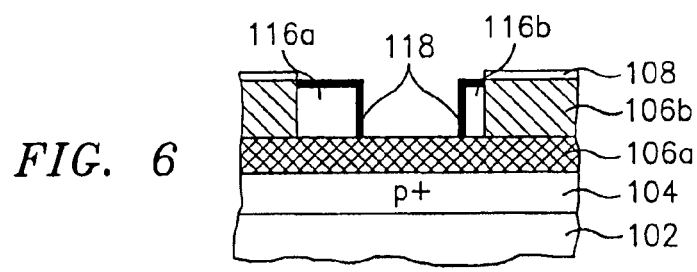

With reference to FIG. 6, a spacer etching process is performed to form spacer gates 116a, 116b. A gate dielectric formation process is then performed on the outer surface of the spacer gates 116a, 116b to form a dielectric layer 118 thereon. The gate dielectric formation process may entail performing an oxidation process followed by a thin oxynitride deposition process as known in the art.

Figure 7:
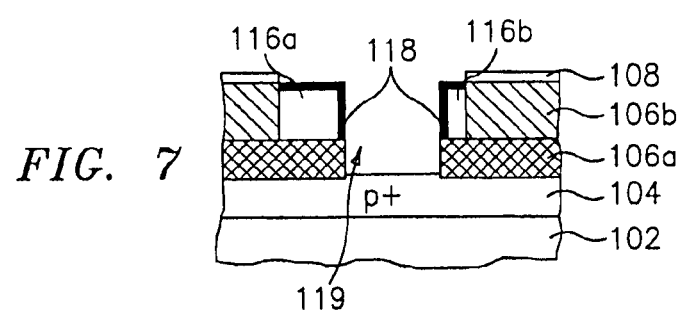

With reference to FIG. 7, an etching process is performed to remove the exposed nitride layer 106a to the surface of the p+ layer 104 to form a thyristor region 119.

Figure 8:
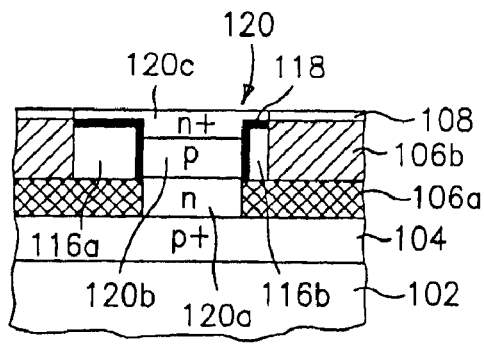

With reference to FIG. 8, an epitaxial growth procedure is performed to form an n-p-n layer 120 having an n layer 120a, a p layer 120b and an n+ layer 120c. The n-p-n layer 120 is formed using a conventional selective epi technique to precisely control the thickness and the doping concentration of each layer.

The n layer 120a is preferably formed by epi with an n-type arsenic impurity with doping concentration of between 2E13/$cm^2$ and 8E14/$cm^2$. The p layer 120b is preferably formed by epi with a p-type boron impurity with doping concentration of between 4E13/$cm^2$ and 1E14/$cm^2$. The n+ layer 120c is preferably formed by epi of an n-type arsenic impurity with doping concentration of between 8E14/$cm^2$ and 3E15/$cm^2$.

Figure 9:
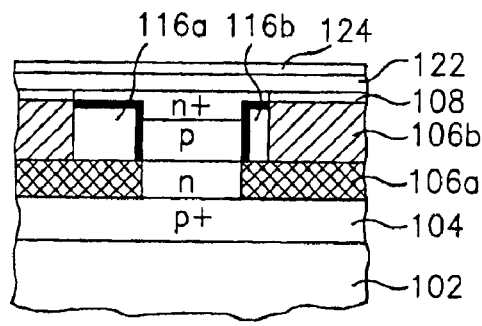

With reference to FIG. 9, an epitaxial lateral overgrowth procedure with a p-doping is performed to form an epi layer 122 for forming the body of the horizontally stacked pseudo-TFT transfer gate. The epi layer 122 is mostly single crystalline, since it uses the n+ layer 120 as the seed material. The epi layer 122 is capped with a dielectric film 124, such as oxide and/or nitride.

Figure 10:
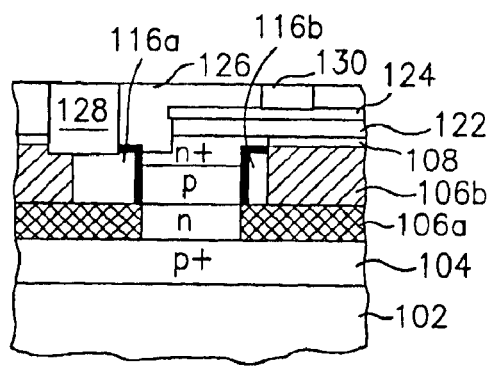

With reference to FIG. 10, the stacked pseudo-TFT transfer gate region is defined by a conventional masking process. A sacrificial insulating film 126, such as CVD oxide, glass, or polymer is deposited over the structure. A Ddamascene gate process is used to form two gates 128, 130. After a chem-mech polish, the upper surfaces of the two gates 128, 130 are co-planar.

Figure 11:
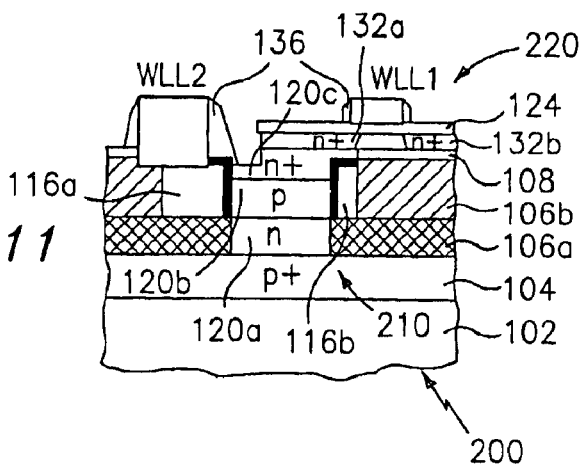

With reference to FIG. 11, the sacrificial insulating film 126 is stripped. An n+ dopant is implanted to create n+ regions 132a, 132b, thereby forming the source and drain regions of the stacked pseudo-TFT transfer gate. The n+ dopant is preferably formed by using an n-type arsenic implant at an energy in the range of 2 to 15 KeV and a dosage of between $8E14/cm^2$ and $3E15/cm^2$. Spacers 136 are then formed to fully fabricate two wordline gates WLL1, WLL2 of a T-RAM memory cell 200.

With reference to FIG. 12 there is shown a top phantom view of the T-RAM cell 200 fabricated according to the present invention and showing the connections to the two wordlines WLL1, WLL2 and a bitline BL. The T-RAM cell 200 has a size measurement of $8F^2$, where F is the minimal printable feature size. It is appreciated that one skilled in the art can modify the process described herein to realize similarly structured T-RAM cells having a size measurement of less than $8F^2$.

Figure 13:
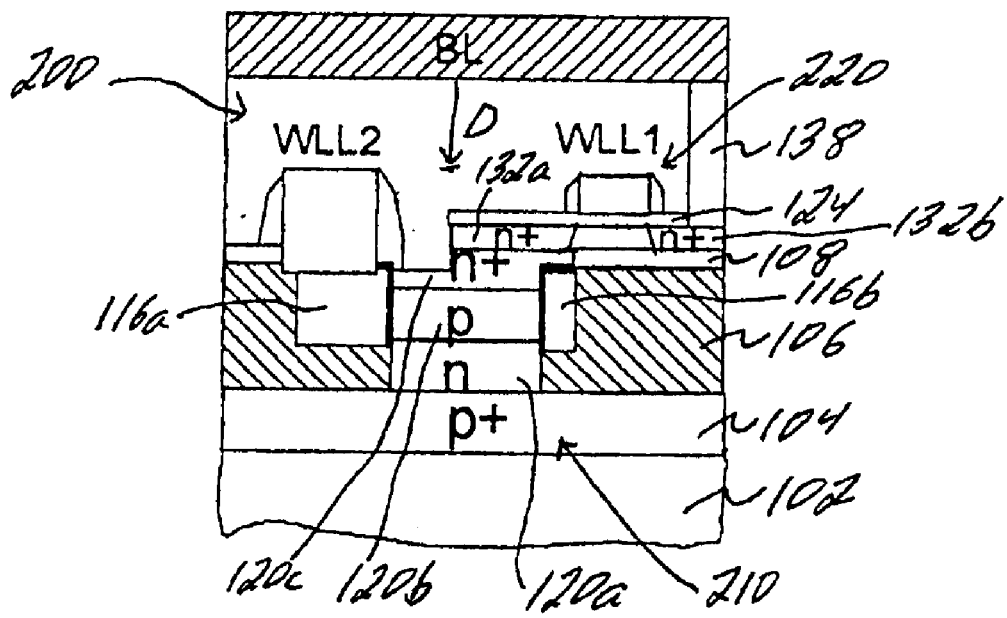
FIG. 13 is a cross-sectional view of a T-RAM cell according to the present invention.

With continued reference to FIG. 12, one of the two wordlines, i.e., wordline WLL2, contacts the bitline BL via a metallic bitline contact 138. The metallic bitline contact 138 is provided in order for the wordline WLL2 to contact the bitline BL and for maintaining a distance "D" from the wordlines WLL1, WLL2 (see FIG. 13).

The heavy line box which is identified by the letters "TR" in FIG. 12 designates the thyristor region of a buried p-n-p vertical thyristor 210. The thyristor region TR contacts wordline WLL1 and is surrounded by a surrounded gate 140. The surrounded gate 140 contacts the wordline WLL2 by a contact stud 138 and is formed by spacer gates 116a, 116b. The box identified by the letters "TGR" designates the transfer gate region of the horizontally stacked pseudo-TFT transfer gate 220. The bitline BL contacts n+ region 132b of the stacked pseudo-TFT transfer gate 220 via contact stud 138.

Figure 14:
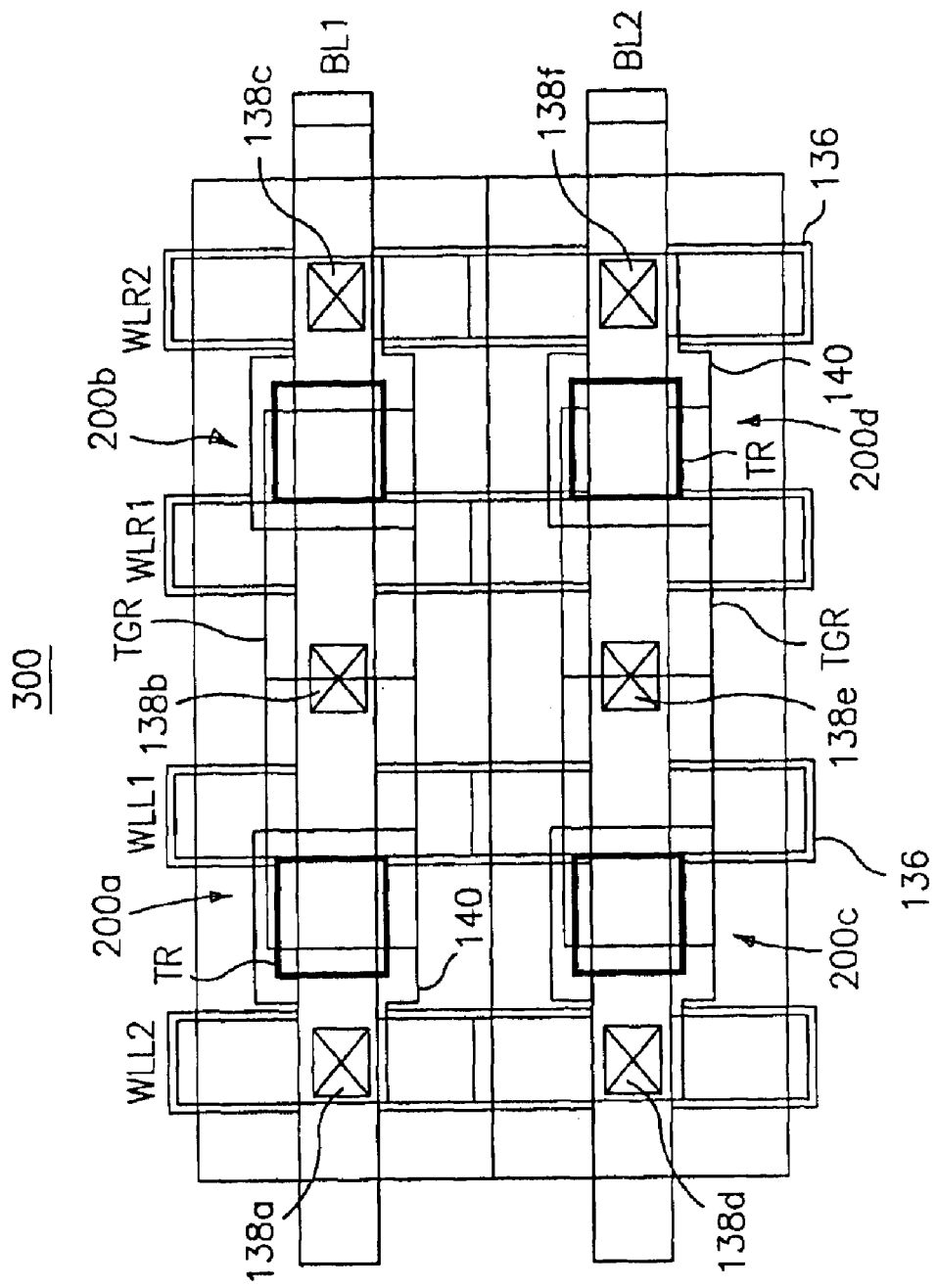
FIG. 14 is a top phantom view of a portion of the T-RAM array showing a plurality of T-RAM cells fabricated according to the present invention.

FIG. 14 is a top phantom view of a portion of a T-RAM array designated by reference numeral 300 showing a plurality of T-RAM cells 200a–d fabricated according to the present invention. FIG. 14 also shows the location of the first and second left wordlines WLL1, WLL2, the location of first and second right wordlines WLR1, WLR2, and the location of first and second bitlines BL1, BL2. A first pair of adjacent cells 200a, 200b of the array 300 share the same bitline contact 138b. A second pair of adjacent cells 200c, 200d of the array 300 share the same bitline contact 138e.

Figure 1:
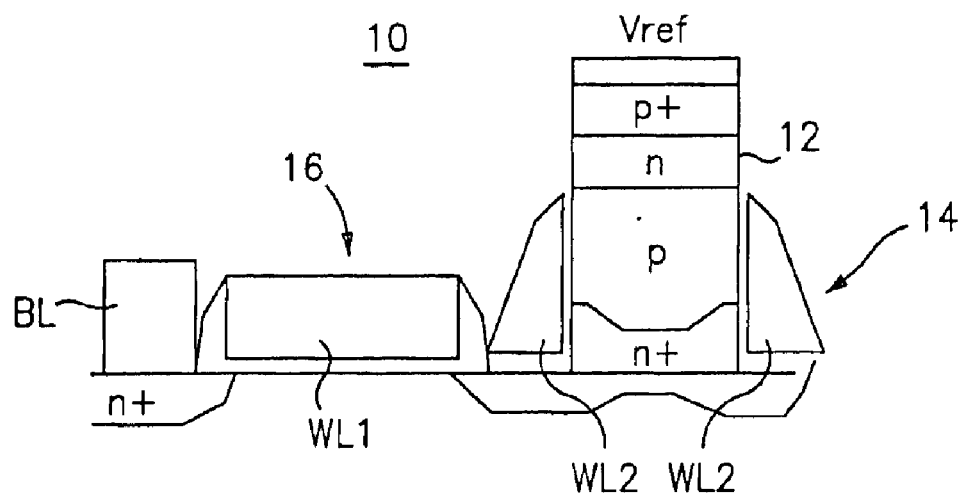
FIG. 1 illustrates the device structure of a prior art T-RAM cell.
Figure 2:
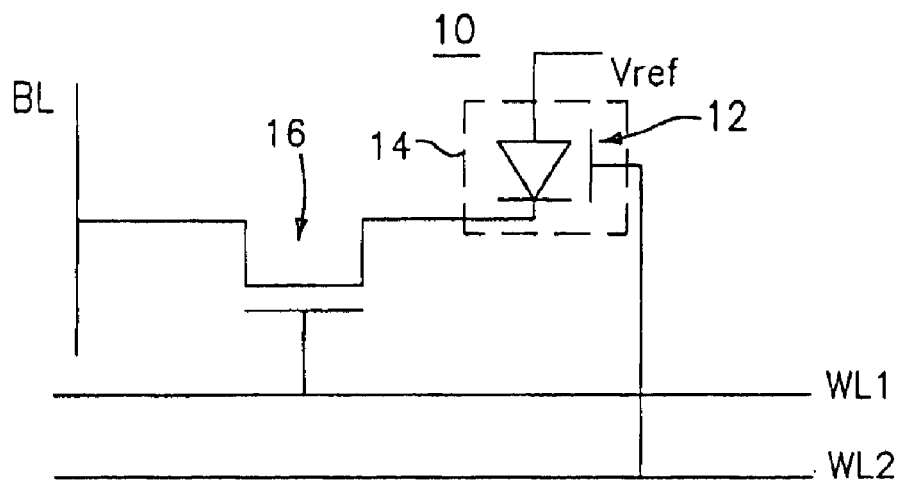
FIG. 2 is a circuit diagram of the prior art T-RAM cell.

With the method of the present invention, minimal process steps and mask levels are required to fabricate planar T-RAM cells 200 of a T-RAM array on bulk or SOI which results in a significant saving in manufacturing cost and provides a better thermal budget over prior art methods. The buried p-n-p vertical thyristor 210 and the horizontally stacked pseudo-TFT transfer gate 220 of each T-RAM cell 200 are simultaneously fabricated in a very compact dimension to reduce manufacturing cost and time, while providing reliable T-RAM cells 200. Additionally, the planar T-RAM array structure is easy to fabricate, since the depth of focus for the lithographic tools and metal interconnects is easier to handle than the three-dimensional vertical device of the prior art T-RAM structure (see FIG. 1).

By sharing etching and diffusion steps, thermal budget is tightly controlled. This leads to better device quality and reliability. Otherwise, extra thermal steps needed to form T-RAM cells will cause the junction depth of the normal device deeper which leads to higher junction capacitance and poorer performance. Additionally, the T-RAM cells having the surrounded gate structure which is fabricated according to the inventive method are suitable for future scaling and metallization than the prior art T-RAM cells which have the vertical thyristor. Further, the structure of the present invention is fully planar and results in higher performance at low voltage (e.g., Vdd=1V).

Further, the method of the present invention provides twin-tower T-RAM cells having a size of less than or equal to $8F^2$. Accordingly, the density of a T-RAM array is small, while the yield and memory performance is high.

A T-RAM array having a plurality of T-RAM cells 200 according to the present invention can be provided within a central processing unit or other type of processor to provide a reliable and high performance memory system.

What has been described herein is merely illustrative of the application of the principles of the present invention. Other arrangements and methods, such as using different substrates, may be implemented by those skilled in the art without departing from the scope and spirit of this invention.

We claim:

1. An array of planar T-RAM cells comprising:
    a plurality of T-RAM cells, said plurality of T-RAM cells being arranged in an array and fabricated over a substrate, each of said plurality of T-RAM cells including a buried vertical thyristor and a horizontally stacked pseudo-TFT transfer gate having a body of a majority portion of single crystalline material using an n+ layer below it as seed material by a epiaxial lateral overgrowth technique, said horizontally stacked pseudo-TFT transfer gate including a source/drain and body, said thyristor being buried underneath said horizontally stacked pseudo-TFT transfer gate, wherein said horizontally stacked pseudo-TFT transfer gate covers at least a portion of said thyristor, and further wherein the top surface of said horizontally stacked pseudo-TFT transfer gate forms a co-planar top surface of each said horizontally stacked pseudo-TFT transfer gate of each said T-RAM cell,
    wherein each of the plurality of T-RAM cells has a size of less than or equal to $6F^2$.

2. The array according to claim 1, wherein said substrate is a semiconductor SOI or bulk wafer.

3. The array according to claim 1, wherein a base of said thyristor is surrounded by a surrounded gate.

4. The array according to claim 1, wherein said planar top surface of each T-RAM cell provides for fabrication of wordlines, said wordlines being fabricated over said planar top surface of said T-RAM cells, said wordlines for interconnecting said T-RAM cells.

* * * * *